United States Patent [19]
Seiji

[11] Patent Number: 5,557,143
[45] Date of Patent: Sep. 17, 1996

[54] SEMICONDUCTOR DEVICE HAVING TWO STAGGERED LEAD FRAME STAGES

[75] Inventor: Hiroshi Seiji, Kyoto, Japan

[73] Assignee: Rohm Co., Ltd., Kyoto, Japan

[21] Appl. No.: 506,823

[22] Filed: Jul. 25, 1995

Related U.S. Application Data

[63] Continuation of Ser. No. 122,099, Sep. 16, 1993, abandoned.

[51] Int. Cl.⁶ ............................................. H01L 23/495
[52] U.S. Cl. ........................ 257/666; 257/692; 257/736
[58] Field of Search ................................. 257/666, 692, 257/696, 784, 736, 672, 666.2, 695

[56] References Cited

FOREIGN PATENT DOCUMENTS

| | | |
|---|---|---|
| 60-107848 | 1/1985 | Japan . |
| 2-26059 | 8/1990 | Japan . |
| 03016250 | 1/1991 | Japan ................................. 257/666.2 |
| 04129258 | 4/1992 | Japan ................................. 257/696 |
| 04180661 | 6/1992 | Japan ................................. 257/666.2 |
| 04199563 | 7/1992 | Japan ................................. 257/666.2 |
| 04199740 | 7/1992 | Japan ................................. 257/666 |

*Primary Examiner*—Sara W. Crane
*Assistant Examiner*—T. M. Arroyo
*Attorney, Agent, or Firm*—Brumbaugh, Graves, Donohue & Raymond

[57] ABSTRACT

A semiconductor device includes a package containing a semiconductor element disposed on a die pad, and a plurality of leads extending from an inside of the package to an outside of the package. The plurality of leads are arranged up and down in a staggered manner, an interval between ends of lower stage leads in the package is narrower than a width of upper stage leads, and ends of the lower stage leads in the package are positioned nearer to the die pad than ends of the upper stage leads.

3 Claims, 2 Drawing Sheets

SEMICONDUCTOR DEVICE HAVING TWO STAGGERED LEAD FRAME STAGES

This application is a continuation of application Ser. No. 08/122,099, filed on Sep. 16, 1993, now abandoned.

BACKGROUND OF THE INVENTION

The present invention relates to a semiconductor device, and particularly relates to a structure of a plurality of leads electrically connected to a semiconductor element.

In a tendency of increase of the number of leads of a semiconductor device with rapid progress in moving forward with high integration and multifunction of a semiconductor device, along with reducing a substrate for mounting the semiconductor device, miniaturizing a package of the semiconductor device is demanded. Basically, reduction of an arrangement interval between each lead, reduction of a width of each lead and the like have been carried out. However, these types of reduction reach a limit in view of precision and strength of the leads. Thus, various methods for miniaturizing a package through change of a structure of the leads have been proposed. An example (Japanese Patent Unexamined Publication No. Hei. 2-26059) of such methods is shown in FIG. 5.

In FIG. 5, a plurality of leads 1 are arranged up and down, lower stage leads 1a and upper stage leads 1b are overlapped with each other, and these are bonded to each other by an electrically insulative adhesive 2 such as an epoxy resin shown by hatching in FIG. 5, so that two-stage structure is formed. End portions of the respective lower stage leads 1a are positioned nearer a die pad 6 than end portions of the respective upper stage leads 1b. The end portions of the respective leads 1a and 1b are connected to a semiconductor element 4 on the die pad 6 through wires 5a and 5b.

The leads are arranged up and down in two stages, so that a size in lead arrangement direction X can be reduced by about ½ as compared with an arrangement in which leads are arranged in the same plane.

Japanese Patent Unexamined Publication No. Sho. 60-107848 proposes a semiconductor device in which leads inside and outside a package are arranged in two stages in a staggered manner so that the package is made compact.

However, according to the package disclosed in Japanese Patent Unexamined Publication No. Hei. 2-26059, (1) the lower stage leads and the upper stage leads are overlapped with each other, so that the respective wires 5a and 5b are arranged in the substantially same vertical plane, and (2) the respective wires 5a and 5b are bonded in a state that the wires have a some degree of sag so that the wires are not broken even if a contracting force at hardening of the package 3, which is formed by hardening the epoxy resin and the like, is applied to the wires. Accordingly, when wire bonding is carried out, or when an epoxy resin as a package agent is injected, there is strong possibility that the upper stage wire 5b is lowered to contact the lower stage wire 5a. Thus, a rate of occurrence of inferior goods due to a short increases to cause reduction of a yield.

As described above, when the structure of leads are changed from a plane structure to an up and down two-stage arrangement structure in order to miniaturize a package, there arises such problems that wire bonding for connecting each lead to a semiconductor element is made complicated, and wires contact with each other.

According to the package disclosed in Japanese Patent Unexamined Publication No. Sho. 60-107848, the end portions of inner leads are arranged in the same plane around a die pad, so that the interval between leads can not be narrowed very much in order to assure insulation between the respective inner leads. Further, the width of the end portion of the inner lead must have a some degree of largeness in order to facilitate the wire bonding to the lead end portion. Accordingly, there is a problem that the number of the inner leads arranged around the die pad is restricted.

SUMMARY OF THE INVENTION

The present invention was made in view of the above described problems. An object of the present invention is therefore to provide a semiconductor device in which a package is made compact, a rate of inferior goods due to contact between bonding wires, which connect leads arranged overcrowdedly by miniaturization to a semiconductor element, is reduced, and wire bonding is facilitated.

The present invention has the following structure in order to achieve the above object.

That is, according to the present invention, in a semiconductor device including a package containing a semiconductor element, and a plurality of leads extending from the inside to the outside of the package, (a) the plurality of leads are arranged up and down in a staggered manner, (b) an arrangement interval between the lower stage leads at end portions of the leads in the package is narrower than a width of the upper stage leads, and (c) the ends of the lower stage leads in the package are positioned nearer a die pad than the ends of the upper stage leads.

The present invention has the following operations and effects.

A plurality of leads are arranged up and down in a staggered manner, and an interval between the lower stage leads in the package is narrower than a .width of the upper stage leads, so that the leads can be arranged in high density in the package, and the package can be made compact.

Further, the upper stage leads and the lower stage leads are arranged in a staggered manner, so that bonding wires for connecting the semiconductor element to the upper and lower stage leads are not disposed in the same vertical plane. Thus, even if an upper wire is lowered at wirebonding or an inflow process of a package agent, there is little possibility that the upper wire contacts a lower wire.

Since the arrangement interval P between the lower stage leads at the ends thereof in the package is narrower than the width W of the upper stage leads (W>P), the upper stage leads are supported by the lower stage leads at the wirebonding, so that the wirebonding to the upper stage leads becomes easy. However, when W>P, the wirebonding to the lower stage leads becomes possibly difficult.

Thus, the ends of the lower stage leads in the package are positioned nearer to the die pad than the ends of the upper stage leads, so that the upper and lower lead ends are alternately arranged in a staggered manner viewed in a plane and the wirebonding to the ends of the lower stage leads becomes easy, too.

DETAILED DESCRIPTION OF THE INVENTION

Preferred embodiments of the present invention will be described with reference to the accompanying drawings.

Figure 1:
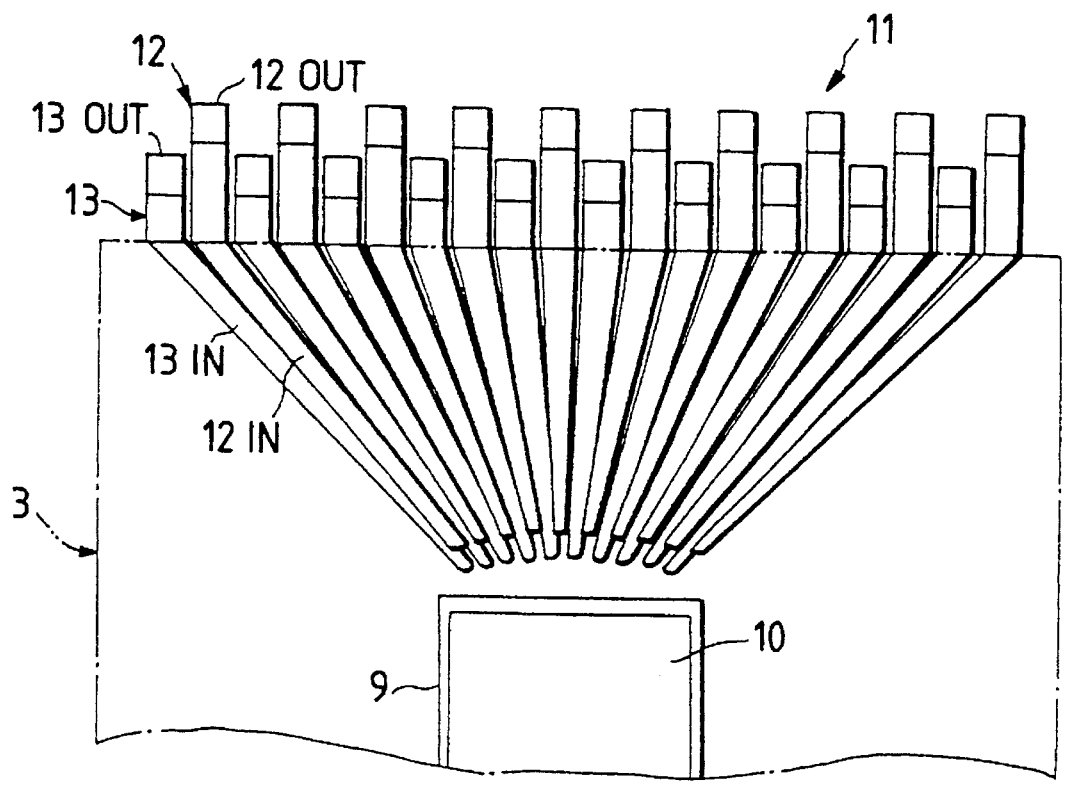
FIG. 1 is a plan view showing a part of a package according to an embodiment of the present invention.
Figure 2:
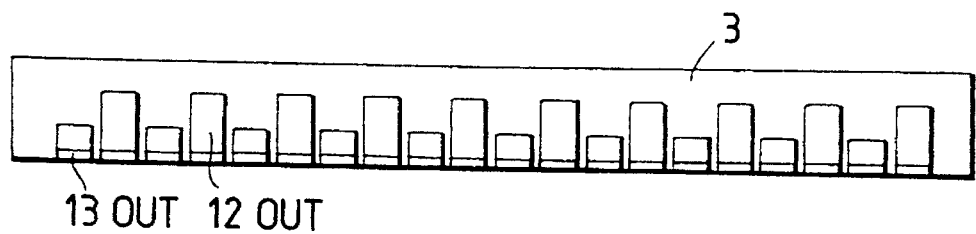
FIG. 2 is a side view of the package of FIG. 1.

FIG. 1 is a plan view showing a part of a package, and FIG. 2 is a side view showing the package.

A plurality of leads 11 extend from the inside to the outside of a package 3 for sealing by an epoxy resin or the like a semiconductor element 10 diebonded onto a die pad 9. The leads 11 are in two-stage structure in which the leads are arranged up and down in a staggered manner along a side of the package 3. In FIG. 1, although only leads 11 extending from one side of the package 3 are shown, the leads 11 extend from four sides of the package 3 or two opposite sides. As clearly illustrated in FIG. 1, each lead 11 has an inner end portion within the package 3 which is narrower than an outer end portion of the same lead 11 outside the package 3.

Among upper stage leads 12 and lower stage leads 13, lead portions extending to the outside of the package 3 (hereinafter referred to as upper stage outer leads 12OUT and lower stage outer leads 13OUT) are arranged at close intervals so as not to overlap with each other. The upper stage outer leads 12OUT and the lower stage outer leads 13OUT are bent once in a stair-shape at the middle, and the lower surfaces of the end portions of the leads are positioned on the substantially same surface as the lower surface of the package 3 or slightly lower than the lower surface of the package. Further, the upper stage outer leads 12OUT extend farther to the outside than the lower stage outer leads 13OUT, so that the end portions of the respective leads are arranged in a staggered manner viewed in a plane.

Figure 3:
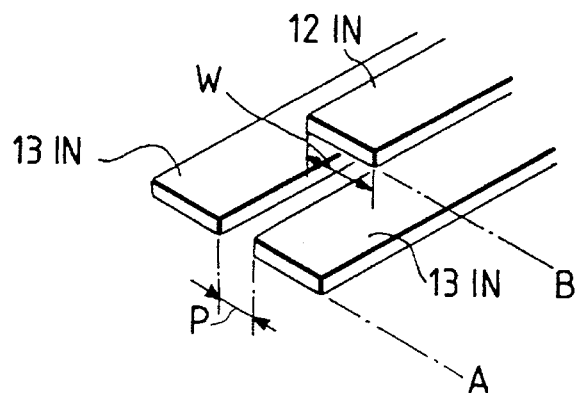
FIG. 3 is an enlarged perspective view showing a part of an inner lead of a package.

Among the upper stage leads 12 and the lower stage leads 13, leads contained in the inside of the package 3 (hereinafter referred to as upper stage inner leads 12IN and lower stage inner leads 13IN) are arranged so as to overlap with each other at the ends. As shown in FIG. 3, the arrangement interval P between the lower inner leads 13IN is narrower than the lead width W of the upper stage inner lead 12IN, that is, W>P. Further, position A of the ends of the lower stage inner leads 13IN is positioned nearer the inside (die pad 9) than position B of the upper stage inner leads 12IN, so that the ends of the respective leads are arranged in a staggered manner viewed in a plane.

The package having the above described structure has the following operations and effects.

(1) The leads 11 inside and outside of the package 3 are arranged up and down in a staggered manner, and the arrangement interval P between the lower stage inner leads 13IN is narrower than the width W of the upper stage inner leads 12IN, so that the leads 11 can be arranged in a high density around the die pad 9.

Figure 4:
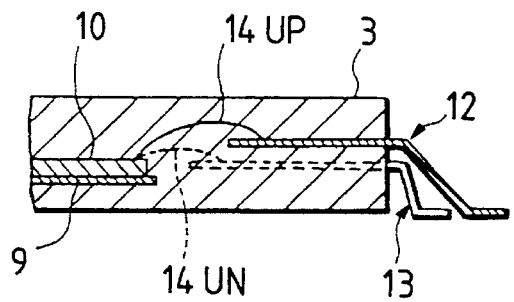
FIG. 4 is a sectional view showing a part of a package.
Figure 5:
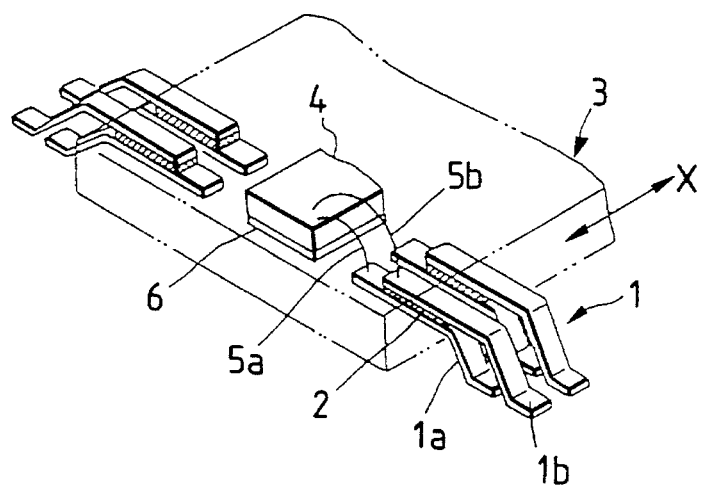
FIG. 5 is a perspective view showing a conventional semiconductor device.

(2) Since the upper stage inner leads 12IN and the lower stage inner leads 13IN are arranged in a staggered manner, as shown in FIG. 4, wires 14UP and 14UN for connecting the respective leads to the semiconductor element 10 are disposed in vertical planes different in position from each other. Accordingly, at the wire bonding or injection of an epoxy resin and the like as a package agent, even if the upper wire 14UP is lowered, there is little possibility for the upper wire 14UP to contact the lower wire 14UN.

(3) Since the width W of the ends of the upper stage inner leads 12IN is wider than the pitch P between the ends of the lower stage inner leads 13IN, and the ends of the upper stage inner leads 12IN and the ends of the lower stage inner leads 13IN are arranged in a staggered manner, even if the leads 11 are arranged overcrowdedly, sufficiently large areas of the ends of the upper and lower inner leads 12IN and 13IN can be assured, and when the inner leads 12IN and 13IN are pushed from an upper position by a pressing plate at the wirebonding, the upper inner leads 12IN are stably supported on the lower inner leads 13IN, so that the wirebonding becomes easy.

As described above, in a semiconductor device according to the present invention, leads are arranged up and down in a staggered manner, an arrangement interval between end portions of lower stage leads in a package is narrower than a width of upper stage leads, and the ends of the lower stage leads in the package are positioned nearer to a die pad than the ends of the upper stage leads. Accordingly, the leads can be contained in the package in high density so that the package can be made compact. Further, the rate of occurrence of inferior goods due to a short can be reduced by avoiding contact of wires for connecting the semiconductor element to the respective leads, and the wirebonding can be made easy.

What is claimed is:

1. A semiconductor device, comprising:

a package containing a semiconductor element on a die pad; and a plurality of leads extending in a diverging array from an inside of said package to an outside of said package, each of the leads having an inner end portion within the package which is narrower than an outer end portion of the same lead outside the package;

wherein said plurality of leads are arranged in a staggered manner and include upper stage leads and lower stage leads;

wherein an interval between inner end portions of said lower stage leads within said package is narrower than a width of said upper stage leads and an interval between outer end portions of the same lower stage leads outside the package is greater than a width of the upper stage leads; and wherein an end of said lower stage leads in said package is positioned nearer to said die pad than an end of said upper stage leads.

2. A semiconductor device as claimed in claim 1, wherein portions of said leads extending from said package to the outside are arranged with an interval so as not to overlap with each other.

3. A semiconductor device as claimed in claim 1, wherein each of said end portions of said upper stage leads in said package is positioned over a space between said lower stage leads so as to overlap alternately with each other.

* * * * *